(12) United States Patent
Leem et al.

(10) Patent No.: US 7,974,326 B2
(45) Date of Patent: Jul. 5, 2011

(54) HYBRID LASER DIODE FOR SINGLE MODE OPERATION AND METHOD OF FABRICATING THE SAME

(75) Inventors: Young-Ahn Leem, Daejeon (KR); Ki-Soo Kim, Daejeon (KR); Jung-Ho Song, Daejeon (KR); O-Kyun Kwon, Daejeon (KR); Gyung-Ock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 76 days.

(21) Appl. No.: 12/118,551

(22) Filed: May 9, 2008

(65) Prior Publication Data

US 2009/0154517 A1 Jun. 18, 2009

(30) Foreign Application Priority Data

Dec. 12, 2007 (KR) .................. 10-2007-0128857

(51) Int. Cl.
*H01S 5/00* (2006.01)

(52) U.S. Cl. .............. 372/50.11; 372/43.01; 372/96

(58) Field of Classification Search .............. 372/50.11
See application file for complete search history.

(56) References Cited

U.S. PATENT DOCUMENTS

| | | | |
|---|---|---|---|
| 4,023,993 A | 5/1977 | Scifres et al. | |
| 4,751,719 A | 6/1988 | Mito et al. | |
| 6,744,804 B2 | 6/2004 | Deng et al. | |
| 6,810,053 B1 * | 10/2004 | Botez et al. | 372/45.01 |
| 2002/0158265 A1 * | 10/2002 | Eisenbeiser | 257/98 |
| 2006/0050744 A1 * | 3/2006 | Wong et al. | 372/3 |
| 2008/0013582 A1 * | 1/2008 | Okamoto et al. | 372/50.11 |

FOREIGN PATENT DOCUMENTS

| | | |
|---|---|---|
| JP | 07-122814 | 5/1995 |
| KR | 1019960027103 | 7/1996 |
| KR | 1020040032375 A | 4/2004 |
| KR | 1020040051905 A | 6/2004 |

OTHER PUBLICATIONS

M. D. McGehee et al, "Semiconducting polymer distributed feedback lasers" Appl. Phys. Lett. vol. 72, num. 13 pp. 1536-1538 (1998).*

M. Meier et al., "Laser action from two-dimensional distributed feedback in photonic crystals", Applied Physics Letters, vol. 74, No. 1, pp. 7-9, Jan. 1999.

* cited by examiner

*Primary Examiner* — Minsun Harvey
*Assistant Examiner* — Xnning Niu

(57) ABSTRACT

Provided are a hybrid laser diode for single mode operation, and a method for manufacturing the hybrid laser diode. The hybrid laser diode includes a silicon layer, an active pattern disposed on the silicon layer, and a bonding layer disposed between the silicon layer and the active pattern. Here, the bonding layer includes diffraction patterns constituting a Bragg grating.

11 Claims, 7 Drawing Sheets

HYBRID LASER DIODE FOR SINGLE MODE OPERATION AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2007-128857, filed on Dec. 12, 2007, the entire contents of which are hereby incorporated by reference.

BACKGROUND OF THE INVENTION

The present invention disclosed herein relates to a photonics device and a method for fabricating the same, and more particularly, to a hybrid laser diode for single mode operation and a method for fabricating the same.

The present invention has been derived from research undertaken as a part of the information technology (IT) development business by the Ministry of Information and Communication and the Institute for Information Technology Advancement of the Republic of Korea [Project management No.: 2006-S-004-02, Project title: silicon-based high-speed optical interconnection IC].

Hybrid laser diodes that employ silicon and III-V compound semiconductors are acknowledged as promising light sources in the field of photonics, a fusion of optical and electronic device technologies. When applying hybrid laser diodes as light sources for data transmission, it is desirable to realize single mode operation laser diodes to improve transmission quality.

As widely known, a laser diode includes an active medium, an energy pumping source, and a resonator. The active medium, also referred to as a gain medium, is a medium in which electron population inversion induced by the pumping mechanism occurs. In a hybrid laser diode, a quantum-confined active layer typically formed of group III-V compound semiconductors is used as the active medium. The energy pumping source supplies energy to induce electron population inversion, which is realized through electrical energy supplied from an electric power supply to the hybrid laser diode. The resonator is configured to provide an optical path through which light with a specific wavelength can reciprocate such that light of the same phase can be amplified by the active medium.

In a typical laser diode, the resonator may be realized through an external resonator formed outside the laser diode or through a diffraction grating. When an external resonator is employed, not only is the size of the device increased, but having to optically connect the resonator presents technical challenges. Accordingly, the use of external resonators is restricted mostly to laser diodes used as variable wavelength light sources.

With the use of a diffraction grating, while the above technical hurdles relating to optical connections can be obviated, it is not easy to realize a single optical mode. That is, laser diodes using diffraction gratings can largely be categorized into distributed Bragg reflector lasers (DBR lasers) and distributed feedback lasers (DFB lasers). While the DBR laser characteristically has at least one distributed Bragg reflector (DBR) disposed outside the active medium to provide periodic changes to the effective refractive index within a waveguide, the DBR laser is more complicated to fabricate than the DFB laser.

The DFB laser is one type of laser diode with its active region directly forming the diffraction grating, and is characterized by its bumped diffraction grating formed on the entire region of the resonator. In this case, the diffraction grating formed provides optical feedback through Bragg scattering. While simpler in terms of fabrication process than the DBR laser as stated above, because the DFB laser provides dual mode oscillation, it cannot easily realize a single mode operation.

Because hybrid laser diodes are fabricated using wafer bonding techniques, surfaces for surface bonding should have a root-mean-square (rms) roughness of below 3 Å. However, as described above, when a diffraction grating for the resonator is bumped, it is difficult to maintain surface conditions to satisfy the above roughness requirement. Moreover, because silicon or InP with high refractive indices is used as materials for diffraction gratings in typical hybrid laser diodes, excessive optical feedback and resultant light distribution localization are manifested. Thus, it has been difficult to use single mode operation technology employing typical diffraction gratings as methods for forming high output single mode hybrid lasers.

SUMMARY OF THE INVENTION

The present invention provides a hybrid laser diode capable of realizing single mode operation.

The present invention also provides a DFB hybrid laser diode capable of generating a high output single mode laser.

The present invention further provides a method for fabricating a hybrid laser diode capable of realizing single mode operation.

Embodiments of the present invention provide hybrid laser diode including: a silicon layer; an active pattern disposed on the silicon layer; and a bonding layer interposed between the silicon layer and the active pattern. The bonding layer includes diffraction patterns constituting a Bragg grating.

In some embodiments, the diffraction patterns of the bonding layer are formed to define openings exposing the silicon layer, the openings being formed at intervals and positions satisfying Bragg's condition in conformity with wavelengths of light generated by the hybrid laser diode.

In other embodiments, the openings are filled with a material having a lower refractive index than the bonding layer.

In still other embodiments, the bonding layer is formed of a material having a lower refractive index than the silicon layer and the active pattern.

In even other embodiments, the bonding layer is a silicon oxide layer.

In yet other embodiments, the bonding layer has a thickness ranging from about 10 nm to about 100 nm.

In further embodiments, the diffraction pattern has a coupling coefficient ranging from about 20 cm−1 to about 100 cm−1, and the coupling coefficient of the diffraction pattern is adjusted by controlling at least one of a thickness of the bonding layer, a refractive index of the bonding layer, and a width of the bonding layer having the diffraction pattern.

In still further embodiments, the bonding layer is extended from the diffraction pattern to cover the silicon layer around the active pattern, and a width of the bonding layer having the diffraction pattern is wider or the same as a width of the diffraction pattern.

In even further embodiments, the silicon layer is used as a slab waveguide, and the active layer is used as a channel waveguide.

In yet further embodiments, the silicon layer is used as a channel waveguide, and the active layer is used as a slab waveguide.

In other embodiments of the present invention, hybrid laser diodes include a silicon layer, a compound semiconductor pattern disposed on the silicon layer, and a resonator assembly formed between the silicon layer and the compound semiconductor pattern, wherein the resonator assembly is formed of materials having lower refractive indices than the silicon layer and the compound semiconductor pattern.

In some embodiments, the resonator assembly has a coupling coefficient ranging from about 20 cm−1 to about 100 cm−1 such that the hybrid laser diode can generate a single mode laser beam.

In other embodiments, the hybrid laser diodes further include a bonding layer interposed between the silicon layer and the compound semiconductor pattern, and defining a plurality of openings exposing the silicon layer, wherein the bonding layer having the plurality of openings is used as the resonator assembly.

In still other embodiments, the plurality of openings are formed at intervals and positions satisfying Bragg's condition corresponding to wavelengths of light generated by the hybrid laser diode.

In even other embodiments, the plurality of openings are filled with a material having a lower refractive index than the bonding layer, such that the plurality of openings constituting Bragg gratings providing optical feedback.

In still other embodiments of the present invention, methods for fabricating a hybrid laser diode include: preparing a substrate having a silicon layer; forming a silicon oxide layer on the silicon layer; attaching a compound semiconductor layer on the substrate by using the silicon oxide layer as a bonding layer; and forming an active pattern by patterning the compound semiconductor layer, wherein the forming of the silicon oxide layer comprises forming a plurality of openings constituting a Bragg grating, the openings being patterned such that the Bragg grating has a coupling coefficient for single mode oscillation.

In some embodiments, the plurality of openings are filled with a material having a lower refractive index than the silicon oxide layer, and the forming of the silicon oxide layer includes patterning the silicon oxide layer such that the silicon oxide layer has a thickness and a width satisfying a coupling coefficient for the single mode oscillation.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, it will be understood that when a layer (or film) is referred to as being 'on' another layer or substrate, it can be directly on the other layer or substrate, or intervening layers may also be present. Further, it will be understood that the dimensions of layers and regions are exaggerated for clarity of illustration. In addition, in various embodiments of the present invention, while terms such as "first", "second", and "third" are used to describe various regions, layers, etc., these regions, layers, etc. should not restricted by said terms. The terms are used solely to differentiate one particular region or layer from another region or layer. Therefore, a layer referred to as a first layer in one embodiment may be referred to as a second layer in another embodiment. The respective embodiments described and exemplified herein include complementary embodiments thereof.

Figure 1:
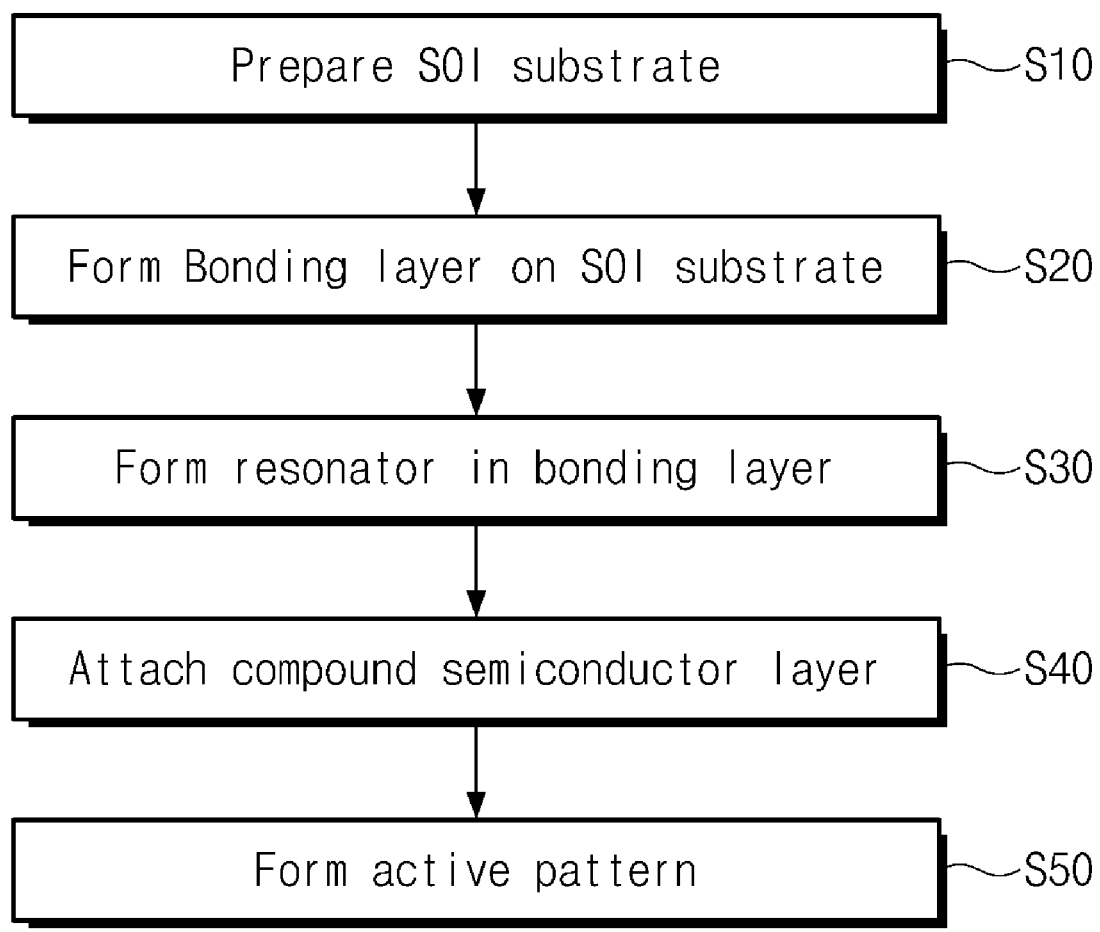
FIG. 1 is a process flowchart of a fabrication method of a hybrid laser diode according to an embodiment of the present invention.

Hereinafter, an exemplary embodiment of the present invention will be described with the accompanying drawings. FIG. 1 is a process flowchart of a fabrication method of a hybrid laser diode according to an embodiment of the present invention, and FIG. 2 is a sectional view of a hybrid laser diode according to an embodiment of the present invention.

Figure 2:
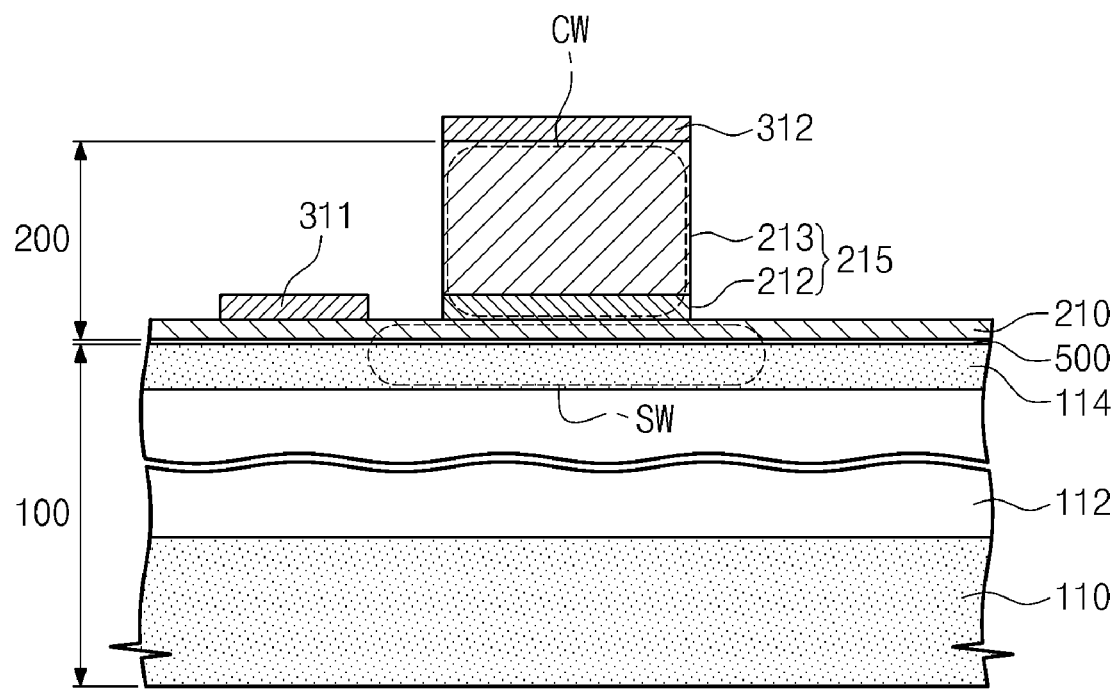
FIG. 2 is a sectional view of a hybrid laser diode according to an embodiment of the present invention.

Referring to FIGS. 1 and 2, a fabrication method of a hybrid laser diode according to the present invention includes preparing a silicon-on-insulator (SOI) wafer 100 including a silicon layer 114 in operation S10, and then forming a bonding layer on the silicon layer 114 in operation S20. The SOI wafer 100 includes a silicon substrate 110, a buried dielectric 112, and the silicon layer 114, stacked in sequence. The bonding layer 500 may be formed of at least one material having a refractive index lower than a silicon or compound semiconductor, and may have a thickness of about 10 nm to about 100 nm. For example, the bonding layer 500 may be a silicon oxide layer formed through a thermal oxidation or chemical vapor deposition process.

Next, the bonding layer 500 is patterned to form openings 510 (in FIGS. 3 and 4) exposing the upper surface of the silicon layer 114 in operation S30. According to the present invention, the bonding layer 500 forms the resonator for lasing. For this end, the openings 510 of the bonding layer 500 may be formed to constitute a diffraction grating. Specifically, the openings 510 are formed at intervals and positions satisfying Bragg's condition corresponding to wavelengths of lasers suitable for lasing. A description relating to the openings 510 and the resonator will be provided in further detail below with reference to FIGS. 3 through 5.

A compound semiconductor substrate 200 is bonded on the SOI wafer 100 using the bonding layer 500 in which the openings 510 are formed in operation S40, and then, the compound semiconductor substrate 200 is patterned to form an active pattern 215 in operation S50. According to one embodiment, the compound semiconductor substrate 200 may include an n-type semiconductor layer 210, an active layer 212, and a p-type semiconductor layer 213. The n-type semiconductor layer 210 may include at least one of an n-type indium-phosphide (InP) layer and an n-type indium-gallium-arsenic-phosphide (InGaAsP) layer, and the active layer 212 may include at least one of an indium-gallium-arsenic-phosphide (InGaAsP) layer and an aluminum-gallium-indium-arsenic (AlGaInAs) layer. Also, the p-type semiconductor layer 213 may include at least one of a p-type indium-phosphide (p-type InP) layer, a p-type indium-gallium-arsenic-phosphide (p-type InGaAsP) layer, a p-type indium-gallium-arsenic (p-type InGaAs) layer, and a p-type aluminum-gallium-indium-arsenic (p-type AlGaInAs) layer. Exemplary compositional materials for the n-type semiconductor layer 210, the active layer 212, and the p-type semiconductor layer 213 have been provided only for the sake of describing embodiments of the present invention. It will therefore be noted that the technical characteristics of the present invention shall not be limited to the exemplary materials. That is, while not specifically mentioned, various other well-known materials may be used to form the hybrid laser diode according to the present invention.

According to an embodiment of the present invention, the p-type semiconductor layer 213 and the active layer 212 are patterned to expose the upper surface of the n-type semiconductor layer 210, and as shown in the drawings, form a channel waveguide CW that is narrower in width than the slab waveguide (SW). Next, a p-electrode 312 and an n-electrode 311 are formed on the upper surfaces of the p-type semiconductor layer 213 and the exposed n-type semiconductor layer 210, respectively, to supply current to light-emitting diodes.

Figure 3:
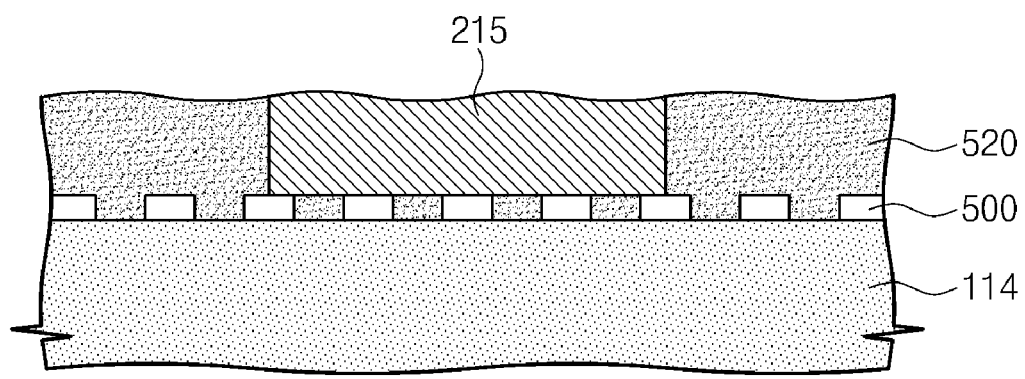
FIG. 3 is a sectional view illustrating the structure of a resonator according to the present invention.
Figure 4:
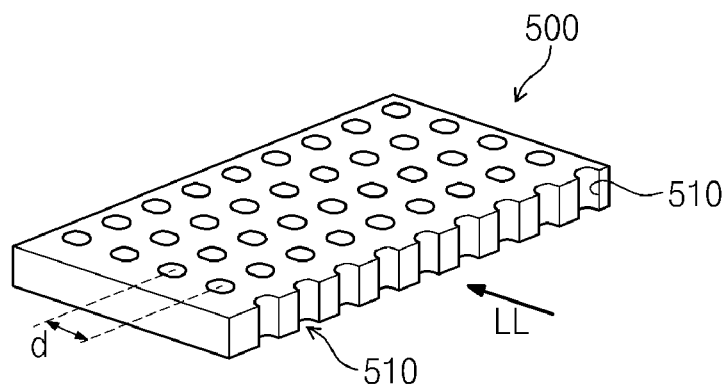
FIGS. 4 and 5 are perspective views of a region of a bonding layer used as a resonator.
Figure 5:
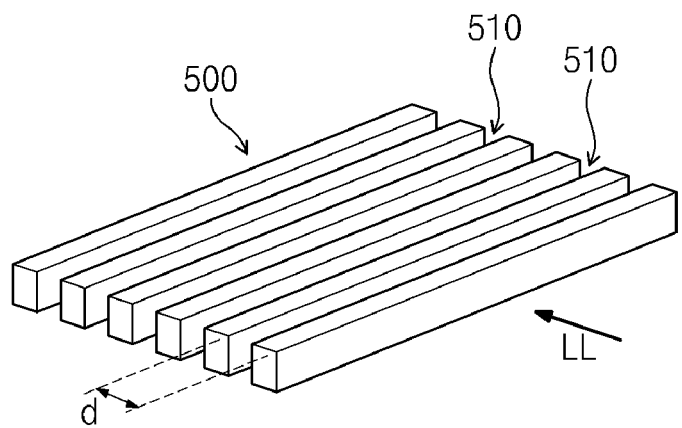

FIG. 3 is a sectional view illustrating the structure of a resonator according to the present invention, and FIGS. 4 and 5 are perspective views of a region of a bonding layer used as a resonator.

Referring to FIG. 3, as described above, a plurality of openings 510 are two-dimensionally arranged within the bonding layer 500. The openings 510 form a diffraction grating to allow for optical feedback from Bragg scattering. For this purpose, the bonding layer 500 is formed of a material having a lower refractive index than the silicon layer 114 and the active pattern 215, and the openings 510 are each filled with a gapfill medium 520 with a lower refractive index than the bonding layer 500. For example, the bonding layer 500 may be a silicon oxide layer with a refractive index of about 1.5, and the gapfill medium 520 may be air with a refractive index of about 1.

The openings 510 may be respectively formed as isolated islands, as illustrated in FIG. 4, or lines or stripes, as illustrated in FIG. 5. Here, a distance (d) between the openings 510 is configured to satisfy Bragg's condition for constructive interference, such that feedback from Bragg scattering can be used for lasing. The distance (d) may be a gap between two adjacent openings 510, which are disposed along a traveling direction of light generated in the active pattern 215.

To generate a single mode laser beam, it is necessary to either reduce a refractive index difference between two materials forming the diffraction grating (i.e., the bonding layer 500 and the gapfill medium 520) or to decrease the height of the bonding layer 500. Specifically, when the diffraction grating is formed of two materials with a large refractive index discrepancy, because reflectance and the coupling coefficient of light increase at each grating pattern, light incident to the inside of the diffraction grating is in resonant mode within localized regions. Since this phenomenon makes it difficult to realize a single mode laser, only a small resonator can generate a single mode laser beam. However, if the resonator is small, it is difficult to increase an output power of laser. Thus, in order to generate a single mode laser, a diffraction grating needs to be formed with a proper coupling coefficient (e.g., from about 20-100 $cm^{-1}$).

Typically, openings for diffraction gratings are formed in a silicon layer or a compound semiconductor layer with a refractive index of about 4 or 3.5, and the openings are filled with air or a silicon oxide layer with a low refractive index. Because a coupling coefficient of diffraction gratings is proportional to the difference of the squared refractive indices, typical diffraction gratings are accompanied by the aforementioned technical problems due to a large difference between refractive indices. Specifically, in the case where the depth of openings formed in a silicon layer or a compound semiconductor layer is about 20 nm, the coupling coefficient of the diffraction gratings is an excessively large value of about 600 $cm^{-1}$, so that it is difficult to generate a single mode laser. Although the required coupling coefficient can be obtained by forming the openings with a depth of about 2 nm, such shallow depth of an opening is unrealizable, because it is beyond the controllable minimum of process variation.

In contrast, the openings 510 in the present invention are formed in a bonding layer 500 with a low refractive index, and the openings 510 are filled with a gapfill medium 520 with a refractive index lower than the bonding layer 500. As a result, the difficulty of realizing a single mode lasing due to a large difference between refractive indices can be largely reduced in the present invention. That is, a coupling coefficient of about 20-100 $cm^{-1}$, which is required for the single mode lasing, can be easily realized by the resonator using the bonding layer 500. Preferably, the coupling coefficient may be about 40-70 $cm^{-1}$.

When different materials come into contact, differences in lattice constants and thermal expansion coefficients may results in stress therebetween. Such stress may result in defects in the active pattern, and therefore, a wafer bonding process should be performed under a limited temperature condition. However, according to the present invention, the openings formed in the bonding layer 500 are formed to expose the silicon layer, and thus, the openings contribute to alleviating such stress.

Figure 6:
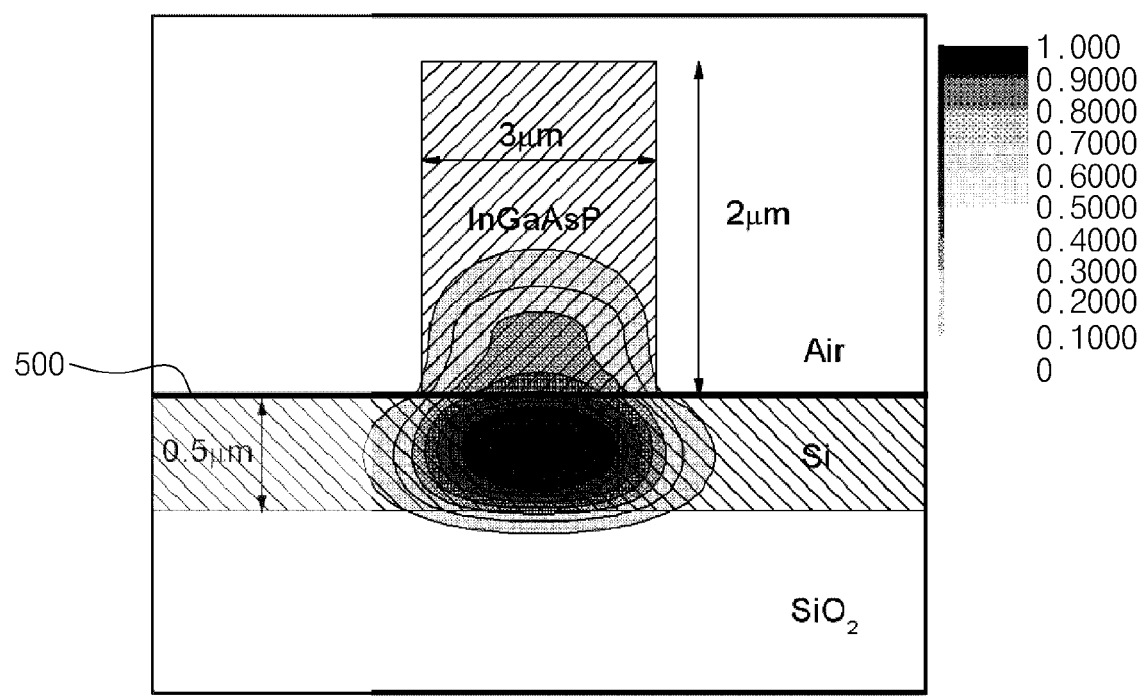
FIG. 6 is a simulation result illustrating optical modes generated by a hybrid laser diode according to an embodiment of the present invention.

FIG. 6 is a simulation result illustrating optical modes generated by a hybrid laser diode according to an embodiment of the present invention. The simulation was performed using the BeamPROP FullWAVE BandSOLVE simulator manufactured by RSoft, under the conditions of materials, thicknesses, and widths of channel waveguide (CW) in the table below.

TABLE 1

|  | p-type Semiconductor Layer (213) | Active Layer (212) | n-type Semiconductor Layer (210) | Bonding Layer (500) | Silicon Layer (114) | Imbedded Dielectric (112) |
|---|---|---|---|---|---|---|
| Material | p-type InP | InGaAsP | n-type InP | $SiO_2$ | Si | $SiO_2$ |
| Thickness (μm) | 1.529 | 0.3 | 0.2 | 0.02 | 0.5 | 3 |
| Width (μm) | 3 | 3 | — | — | — | — |

Referring to FIG. 6, a transverse waveguide mode of a laser was mainly distributed within the silicon layer 114, but a part of the transverse waveguide mode was also distributed within the bonding layer, which is used as a resonator of the present invention. The coupling coefficient of a diffraction grating may be dependent on the intensity of a waveguide mode in the bonding layer 500. The intensity of the waveguide mode in the bonding layer 500 may be adjusted through methods of altering the geometric structure of a device, such as adjusting the thickness of the silicon layer 114.

Figure 7:
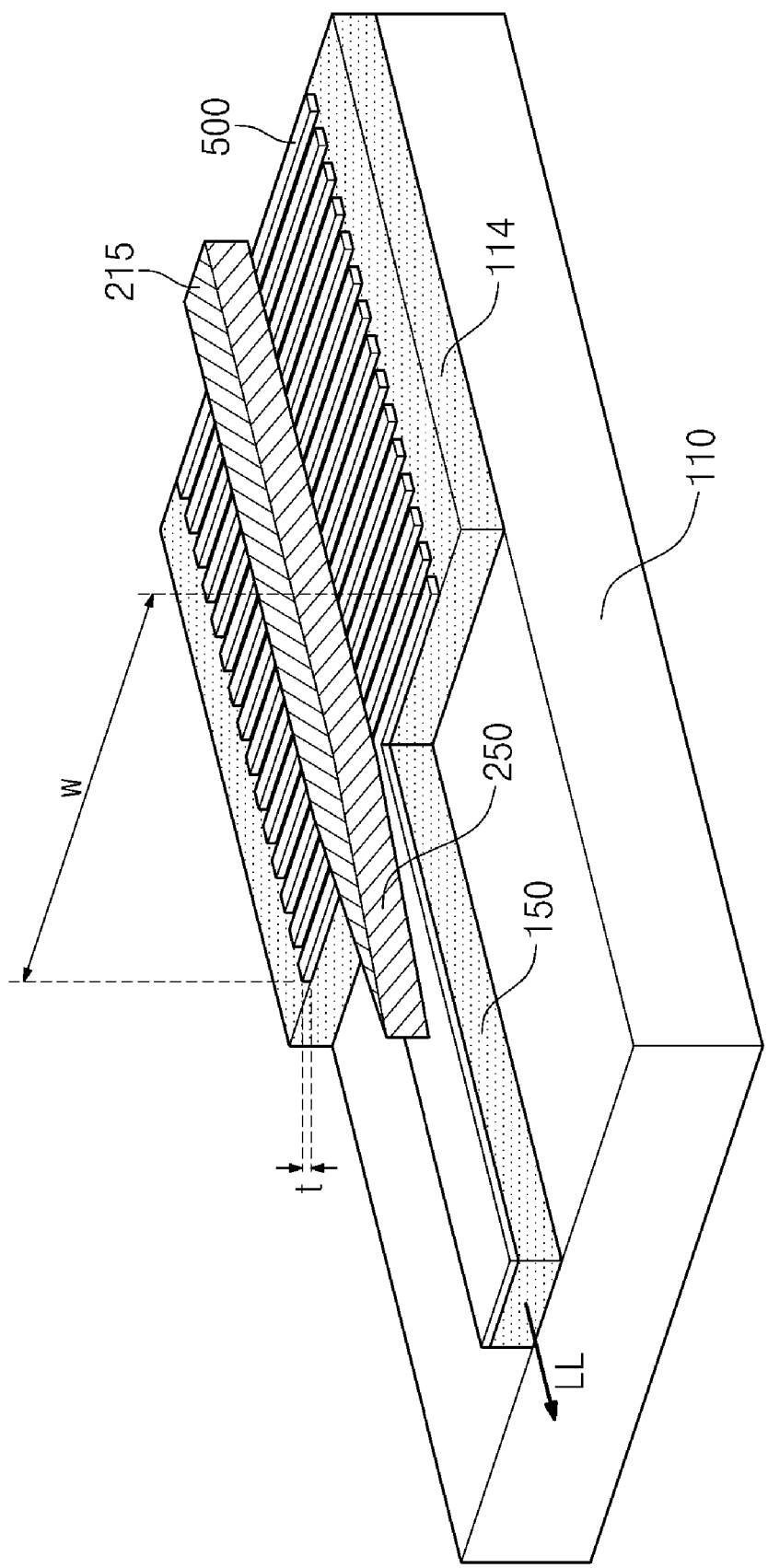
FIG. 7 is a perspective view illustrating the technical characteristics of a hybrid laser diode according to an embodiment of the present invention.

FIG. 7 is a perspective view illustrating the technical characteristics of a hybrid laser diode according to an embodiment of the present invention. A hybrid laser diode according to the present embodiment is similar to those of the above-described embodiments with reference to FIGS. 2 through 5, and therefore, repetitive descriptions will not be given.

Referring to FIG. 7, the bonding layer 500 includes a grating region in which the openings 510 are formed, and is interposed between an active pattern 215 and a silicon layer 114. The openings 510 formed in the grating region may be formed as lines or stripes as illustrated; however, they may be also arranged two-dimensionally with the shape of islands, as illustrated in FIG. 4. As described above in previous embodiments, the openings 510 may be filled with air, or with a solid gapfill medium having a refractive index lower than the bonding layer 500.

As illustrated, the bonding layer 500 may be laterally extended from the lower portion of the active pattern 215 to cover the upper surface of the silicon layer 114 forming a slab waveguide. Here, the openings 510 may be formed along a direction intersecting the active pattern 215, and may have a width (w) that is greater than or equal to the width of the active pattern 215.

According to the present invention, the coupling coefficient of the diffraction grating may be adjusted using various methods to have the preferred value of about 40-70 cm$^{-1}$. For example, the coupling coefficient of the diffraction grating may be controlled by changing the thickness of the bonding layer 500, changing materials of bonding layer 500 and gapfill medium 520, and adjusting the width of the grating region. In particular, as will be explained with respect to FIG. 8, the coupling coefficient can be finely adjusted by adjusting the width of the grating region, and thus, the present invention allows for fabrication of a hybrid laser diode with improved performance.

A hybrid laser diode according to the present invention may further include a connecting waveguide 150 to transmit a generated laser light (LL) to a predetermined optical device (not shown). The optical device may be integrated on the buried dielectric 112 and/or the silicon layer 114, and may be an optical medium for an optical connection with the silicon layer 114. In this case, the connecting waveguide 150 extends from the slab waveguide (SW) made of the silicon layer 114 to the optical device.

As illustrated in FIG. 6, the waveguide mode may be distributed mainly in the silicon layer 114. Nevertheless, if the confinement factor at the silicon layer 114 is small, an output power of the laser light (LL) propagated through the connecting waveguide 150 may be substantially reduced. In this aspect, a hybrid laser diode may be made highly efficient at transmitting a waveguide mode from a channel waveguide (CW) to the connecting waveguide 150. To increase the transmitting efficiency, a coupling region 250 may be disposed extending from the upper portion of the connecting waveguide 150 to the channel waveguide (CW). The coupling region 250, as illustrated, may have a tapered shape.

The transmitting efficiency is dependent on geometric characteristics of elements such as thickness and width of the connecting waveguide 150. Accordingly, a method of adjusting dimensional properties of the connecting waveguide 150, the channel waveguide (CW), and the slab waveguide (SW) may be used as a method of controlling the transmitting efficiency and the waveguide mode. To obtain a sufficiently high transmitting efficiency, the connecting waveguide 150 may be given a greater width than the active pattern 215.

Figure 8:
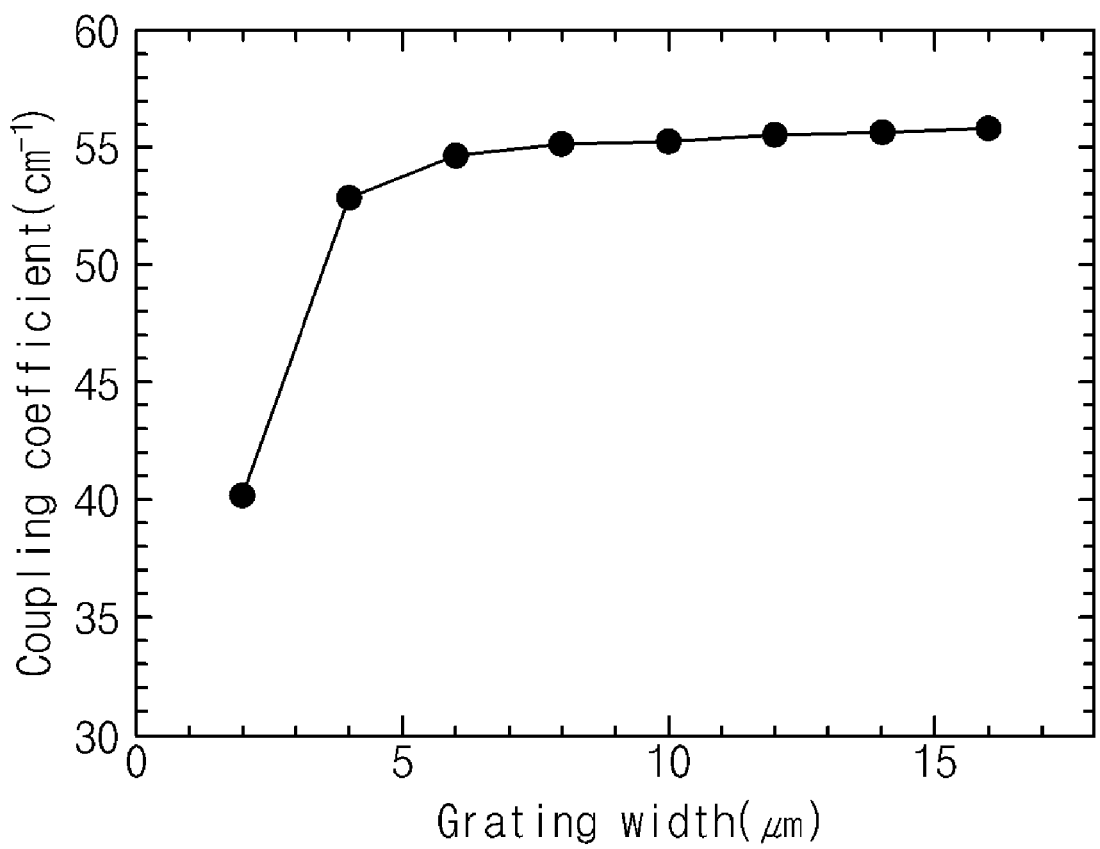
FIG. 8 is a graph illustrating simulation results of the relationship between the width of a diffraction grating region and coupling coefficients of the region.

FIG. 8 is a graph illustrating simulation results of the relationship between the width of a grating region and coupling coefficients of the region. This simulation was performed under the conditions that the bonding layer 500 and the gapfill medium 520 are a silicon oxide layer and air, respectively, and the bonding layer 500 has a thickness of 20 nm. In the graph, the horizontal axis represents the grating region width ('d' in FIG. 7), and the vertical axis represents the coupling coefficient. Also, a minimum width (2 μm) of the grating region in the horizontal axis corresponds to the width of the active pattern.

Referring to FIG. 8, the coupling coefficient increases from about 40 cm$^{-1}$ to about 55 cm$^{-1}$ as the width of the grating region increases. Specifically, while the coupling coefficient has a saturated value of about 55 cm$^{-1}$ at the widths of the grating region above 5 μm, a sharp rise occurs between about 2 μm to 5 μm. From this, it is discernible that fine adjustments can be made to the coupling coefficient by adjusting the width of the grating region.

Figure 9:
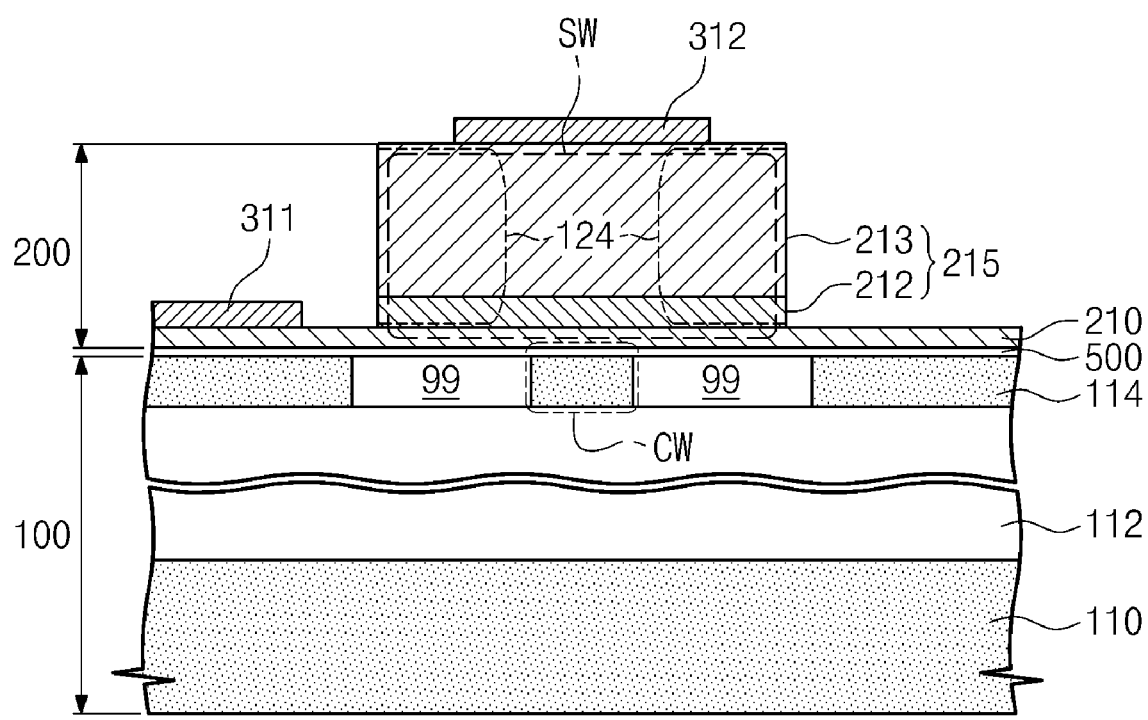
FIG. 9 is a sectional view of a hybrid laser diode according to another embodiment of the present invention.

FIG. 9 is a sectional view of a hybrid laser diode according to another embodiment of the present invention. With the exception of the silicon layer used as the channel waveguide, other elements in the present embodiment are the same as those in the previous embodiments, and repetitive descriptions will therefore not be given.

Referring to FIG. 9, according to the present embodiment, prior to the attaching process of the compound semiconductor layer 200, an operation of patterning the silicon layer 114 to form a channel waveguide (CW) is performed. That is, a void region (99) to expose the buried dielectric 112 is formed around the silicon layer 114 constituting the channel waveguide (CW).

Next, after the bonding layer 500 is formed, it is patterned to form openings 510 (in FIGS. 3 and 4) constituting a Bragg grating. The openings 510 may be formed through any of methods described in previous embodiments. In modified embodiments of the present invention, the forming of the bonding layer 500 and the openings 510 may be performed before the patterning of the silicon layer 114 to form the channel waveguide (CW).

Next, after the compound semiconductor layer 200 is attached to the bonding layer 500, the compound semiconductor layer 200 is patterned to form an active pattern 215. The compound semiconductor substrate 200 includes an n-type semiconductor layer 210, an active layer 212, and a p-type semiconductor layer 213, stacked in sequence, and the forming of the active pattern 215 includes patterning the p-type semiconductor layer 213 and the active layer 212 such that the upper surface of the n-type semiconductor layer 210 is exposed. According to the present embodiment, the active pattern 215 is patterned to have a width greater than that of the channel waveguide (CW) to form a slab waveguide (SW).

According to embodiments of the present invention, the bonding layer 500 with the openings 510 may be formed on the lower surface of the n-type semiconductor layer 210 of the compound semiconductor layer 200 instead of on the upper surface of the silicon layer 114.

According to the present invention, a diffraction grating for laser resonance is formed in a bonding layer for attaching between a silicon layer and a compound semiconductor layer. Because the bonding layer may be formed thin, the diffraction grating formed in the bonding layer may have a coupling coefficient less than a diffraction grating formed in a silicon layer or a compound semiconductor layer. Thus, a laser beam generated from a hybrid laser diode according to the present invention may have a single mode.

Furthermore, according to the present invention, the coupling coefficient of the diffraction grating can be precisely controlled through process variables that are easy to control, such as the thickness of the bonding layer and the width of the region over which the diffraction grating is formed. As a result, a hybrid laser diode according to the present invention is not only able to generate a single mode laser beam, but is also given an improved level of performance.

In addition, according to the present invention, the openings formed in the bonding layer are formed to expose the silicon layer. Therefore, stress due to a difference in lattice constant and a difference in thermal expansion coefficient is alleviated in a hybrid laser diode according to the present invention, and technical limitations relating to conditions of thermal treatment processes can be alleviated in a fabrication process of a hybrid laser diode according to the present invention.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A hybrid laser diode comprising,
a silicon layer configured to be a first waveguide;
a compound semiconductor active pattern formed over the silicon layer and configured to be a second waveguide; and
a bonding layer formed between the silicon layer and the compound semiconductor active pattern,
wherein the bonding layer includes diffraction patterns constituting a Bragg grating,
wherein the hybrid laser diode employs a distributed feedback laser (DFB laser),
wherein the diffraction patterns of the bonding layer includes openings configured to satisfy Bragg's condition corresponding to a wavelength of light generated by the hybrid laser diode,
wherein the openings has a lower refractive index than the bonding layer, and
wherein the bonding layer has a lower refractive index than the silicon layer and the compound semiconductor active pattern.

2. The hybrid laser diode of claim 1, wherein the bonding layer is a silicon oxide layer.

3. The hybrid laser diode of claim 1, wherein the bonding layer has a thickness ranging from about 10 nm to about 100 nm.

4. The hybrid laser diode of claim 1, wherein the diffraction pattern has a coupling coefficient ranging from about 20 cm$^{-1}$ to about 100 cm$^{-1}$, and the coupling coefficient of the diffraction pattern is adjusted by controlling any of a thickness of the bonding layer, a refractive index of the bonding layer, and a width of the bonding layer.

5. The hybrid laser diode of claim 1, wherein the bonding layer is extended from the diffraction pattern to cover the silicon layer around the compound semiconductor active pattern, and a width of the bonding layer having the diffraction pattern is wider or the same as a width of the diffraction pattern.

6. The hybrid laser diode of claim 1, wherein the silicon layer is used as a slab waveguide, and the compound semiconductor active layer is used as a channel waveguide.

7. The hybrid laser diode of claim 1, wherein the silicon layer is used as a channel waveguide, and the active layer is used as a slab waveguide.

8. A hybrid laser diode comprising:
a silicon layer;
a compound semiconductor pattern formed over the silicon layer; and
a resonator assembly formed between the silicon layer and the compound semiconductor pattern,
wherein the resonator assembly has lower refractive indices than the silicon layer and the compound semiconductor pattern,
wherein the hybrid laser diode employs a distributed feedback laser (DFB laser),
wherein the resonator assembly includes a bonding layer interposed between the silicon layer and the compound semiconductor pattern,
wherein the bonding layer includes a plurality of openings,
wherein the bonding layer has a lower refractive index than the silicon layer and the compound semiconductor pattern, and
wherein the openings have a lower refractive index than the bonding layer.

9. The hybrid laser diode of claim 8, wherein the openings configured to satisfy Bragg's condition corresponding to a wavelength of light generated by the hybrid laser diode.

10. The hybrid laser diode of claim 8, wherein the openings are filled with a material having a lower refractive index than the bonding layer such that the openings constitute Bragg gratings capable of providing optical feedback.

11. A hybrid laser diode comprising,
a silicon layer configured to be a first waveguide;
a compound semiconductor pattern formed over the silicon layer and configured to be a second waveguide; and
a bonding layer formed between the silicon layer and the compound semiconductor pattern,
wherein the hybrid laser diode employs a distributed feedback laser (DFB laser)
wherein the bonding layer includes openings configured to satisfy Bragg's condition,
wherein the bonding layer has a lower refractive index than the silicon layer and the compound semiconductor pattern, and
wherein the openings have a lower refractive index than the bonding layer.

* * * * *